United States Patent
Kono

(10) Patent No.: US 8,391,052 B2
(45) Date of Patent: Mar. 5, 2013

(54) NONVOLATILE SEMICONDUCTOR MEMORY DEVICE

(75) Inventor: Fumihiro Kono, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 201 days.

(21) Appl. No.: 13/043,736

(22) Filed: Mar. 9, 2011

(65) Prior Publication Data

US 2011/0299320 A1     Dec. 8, 2011

(30) Foreign Application Priority Data

Jun. 3, 2010   (JP) .................................. 2010-127625

(51) Int. Cl.
*G11C 11/00*        (2006.01)
(52) U.S. Cl. ................ 365/148; 365/163; 365/189.16
(58) Field of Classification Search ............... 365/34
See application file for complete search history.

(56) References Cited

U.S. PATENT DOCUMENTS

| | | | |
|---|---|---|---|
| 7,054,183 B2 * | 5/2006 | Rinerson et al. | 365/148 |
| 7,372,725 B2 * | 5/2008 | Philipp et al. | 365/163 |
| 7,936,586 B2 * | 5/2011 | Hosono et al. | 365/148 |
| 2011/0299319 A1 | 12/2011 | Kono | |

FOREIGN PATENT DOCUMENTS

| | | |
|---|---|---|
| JP | 2009-93724 | 4/2009 |
| JP | 2010-80041 | 4/2010 |
| JP | 2011-253595 A | 12/2011 |

OTHER PUBLICATIONS

U.S. Appl. No. 12/876,746, filed Sep. 7, 2010, Fumihiro Kono.
U.S. Appl. No. 13/018,832, filed Feb. 1, 2011, Fumihiro Kono.

* cited by examiner

*Primary Examiner* — Tan T. Nguyen
(74) *Attorney, Agent, or Firm* — Oblon, Spivak, McClelland, Maier & Neustadt, L.L.P.

(57) ABSTRACT

A nonvolatile semiconductor memory device includes a memory cell array, the memory cell array including a plurality of first lines, a plurality of second lines configured to intersect the first lines, and a plurality of electrically rewritable memory cells disposed at each of intersections of the first lines and the second lines, each of the memory cells being configured from a variable resistor operative to store a resistance value of the variable resistor as data in a nonvolatile manner. A voltage supply circuit applies a certain voltage to the memory cells via the first lines and the second lines during writing data to the memory cells or forming of the memory cells. A detection circuit detects a change of the resistance value of the variable resistor in the memory cell during application of the certain voltage to the memory cells and outputs the detected change of the resistance value of the variable resistor as detection information. An output circuit outputs to external at least a portion of the detection information outputted from the detection circuit.

20 Claims, 10 Drawing Sheets

NONVOLATILE SEMICONDUCTOR MEMORY DEVICE

CROSS-REFERENCE TO RELATED APPLICATIONS

This application is based upon and claims the benefit of priority from the prior Japanese Patent Application No. 2010-127625, filed on Jun. 3, 2010, the entire contents of which are incorporated herein by reference.

FIELD

Embodiments of the present invention relate to a nonvolatile semiconductor memory device.

BACKGROUND

A conventionally known example of electrically rewritable nonvolatile memory is flash memory which is configured as a cell array of NAND-connected or NOR-connected memory cells each having a floating gate structure. Also known as a nonvolatile memory capable of high speed random access is ferroelectric memory.

In addition, a technology proposed to achieve increased miniaturization of memory cells is resistive type memory which uses a variable resistor as the memory cell. Known examples of the variable resistor include the likes of a phase change memory element in which the resistance value is varied by changing between the crystalline and amorphous states of a chalcogenide compound, an MRAM element which utilizes resistance variation due to tunnel magnetoresistance effect, a polymer ferroelectric RAM (PFRAM) element which has a resistor formed by a conductive polymer, and a ReRAM element in which resistance variation is caused by electrical pulse application.

Of these, the variable resistor used in ReRAM is broadly divided into ones in which resistance variation occurs due to presence/absence of a trapped charge in a charge trap existing at an electrode interface and ones in which resistance variation occurs due to presence/absence of a conductive path induced by oxygen deficiency or the like.

Moreover, the variable resistor used in ReRAM has two kinds of operation modes. In one, referred to as bipolar type, the polarity of applied voltage is switched to set a high-resistance state and a low-resistance state. In the other, referred to as unipolar type, the voltage value and voltage application time are controlled, thus allowing the high-resistance state and the low-resistance state to be set without switching the polarity of applied voltage.

In conventional technology, when performing a rewrite operation of the memory cell, a rewrite voltage is applied for a constant time on a number of occasions and, on each occasion, a verify operation is performed to confirm success/failure of the rewrite. However, the fact that there is variation in the rewrite time of memory cells and that a pass is not achieved in verify until the rewrite operation is completed for all the memory cells leads to the problem that, even though rewrite is completed for the majority of memory cells, rewrite time is determined by a portion of memory cells having slow rewrite speed. In conventional technology, the rewrite condition of such memory cells cannot be ascertained from the outside, and it is thus difficult to shorten the cycle time.

DETAILED DESCRIPTION

A nonvolatile semiconductor memory device in accordance with an embodiment comprises: a memory cell array, the memory cell array including a plurality of first lines, a plurality of second lines configured to intersect the first lines, and a plurality of electrically rewritable memory cells disposed at each of intersections of the first lines and the second lines, each of the memory cells being configured from a variable resistor operative to store a resistance value of the variable resistor as data in a nonvolatile manner; a voltage supply circuit operative to apply a certain voltage to the memory cells via the first lines and the second lines during writing data to the memory cells or forming of the memory cells; a detection circuit operative to detect change in a resistance state of the memory cells during application of the certain voltage to the memory cells and output detection information; and an output circuit operative to output to external at least a portion of the detection information outputted from the detection circuit.

A nonvolatile semiconductor memory device in accordance with an embodiment is now described in detail with reference to the drawings.

First Embodiment

Overall Configuration

Figure 1:
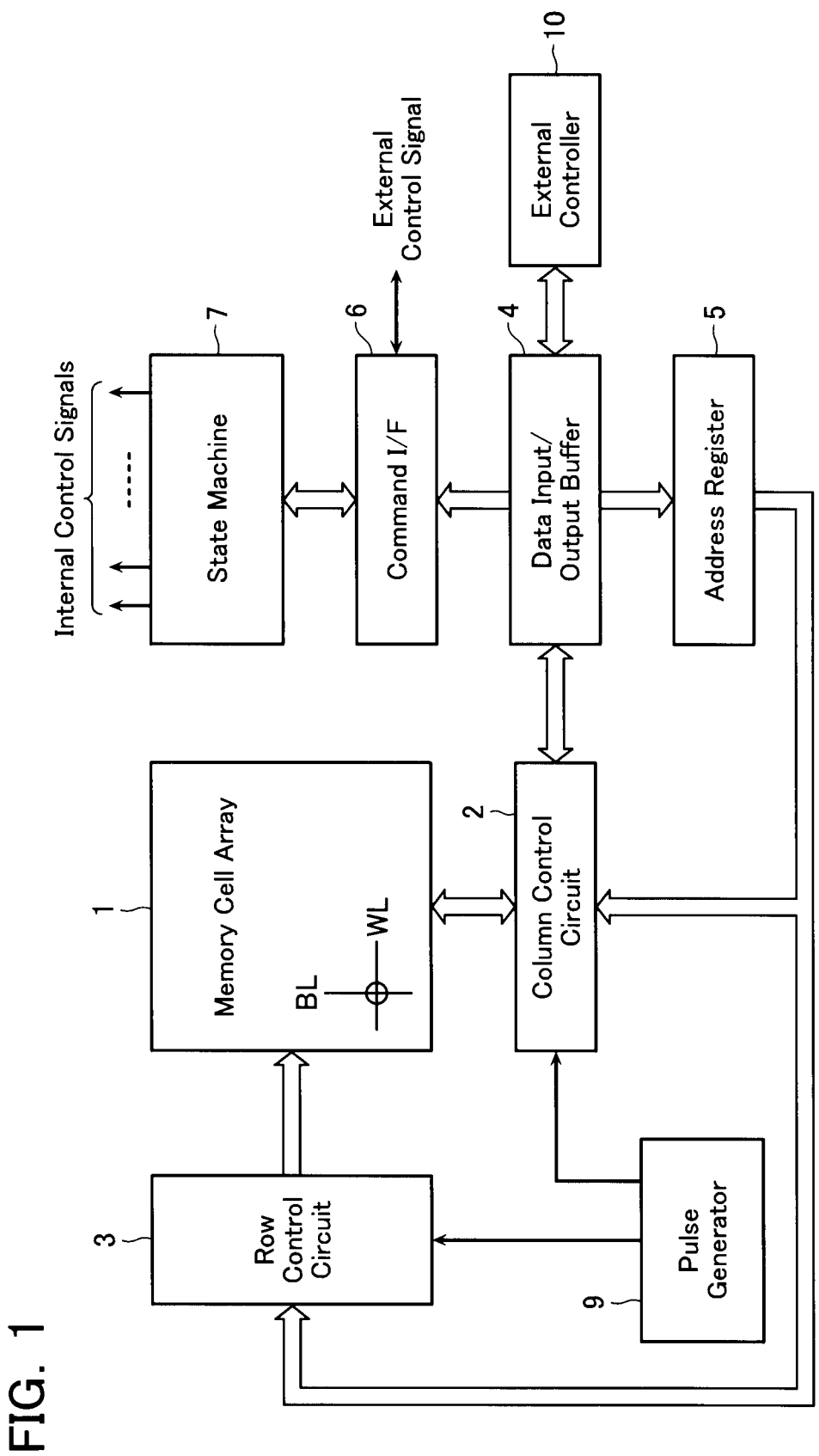
FIG. 1 is a block diagram of a nonvolatile semiconductor memory device in accordance with a first embodiment.

FIG. 1 is a block diagram of a nonvolatile semiconductor memory device in accordance with a first embodiment.

This nonvolatile semiconductor memory device comprises a memory cell array 1 of memory cells arranged in a matrix, each memory cell including a later-described ReRAM (variable resistor). A column control circuit 2 is provided at a position adjacent to the memory cell array 1 in a bit line BL direction. The column control circuit 2 controls bit lines BL in the memory cell array 1 to perform data erase of the memory cells, writing data to the memory cells, and data read from the memory cells. A row control circuit 3 is provided at a position adjacent to the memory cell array 1 in a word line WL direction. The row control circuit 3 selects word lines WL in the memory cell array 1 and applies voltages required in data erase of the memory cells, writing data to the memory cells, and data read from the memory cells.

A data input/output buffer 4 is connected to an external controller 10 via an I/O line to receive write data, receive erase instructions, output read data, receive address data and command data, receive flags outputted according to resistance state in the memory cell array 1, and so on. The data input/output buffer 4 also sends received write data to the column control circuit 2 and receives read data from the column control circuit 2 and outputs it to external. An address supplied from external to the data input/output buffer 4 is sent via an address register 5 to the column control circuit 2 and the row control circuit 3. A command supplied from the external controller 10 to the data input/output buffer 4 is sent to a command interface 6. The command interface 6 receives an external control signal from the external controller 10 and decides whether the data inputted to the data input/output buffer 4 is write data, a command or an address. If the data is a command, then the command interface 6 transfers it as a received command signal to a state machine 7. The state machine 7 is a controller managing the entire nonvolatile memory to receive commands from the external controller 10, and perform read, write, erase, data input/output management, and so on. In addition, the external controller 10 can also receive status information managed by the state machine 7 and judge success/failure of write and erase. This status information is also utilized in control of write and erase. Furthermore, the external controller 10 aggregates inputted information and analyzes this inputted information, thereby enabling operating conditions to be appropriately adjusted.

Further, the state machine 7 controls a pulse generator 9 which is a voltage supply circuit. Under this control, the pulse generator 9 is allowed to output a pulse of any voltage at any timing. Specifically, the state machine 7 inputs the address received from external, via the address register 5, judges which memory layer is to be accessed, and utilizes parameters corresponding to that memory layer to control a height and width of a pulse from the pulse generator 9. These parameters, which are values obtained such that write characteristics and so on ascertained on a memory layer basis become uniform for each memory layer, are stored in the memory cells. The pulse formed herein can be transferred to any line selected by the column control circuit 2 and the row control circuit 3.

Note that peripheral circuit elements other than the memory cell array 1 can be formed in a silicon substrate immediately beneath the memory cell array 1, whereby chip area of the nonvolatile semiconductor memory device can be made almost equal to the area of the memory cell array 1.

[Memory Cell and Memory Cell Array]

Figure 2:
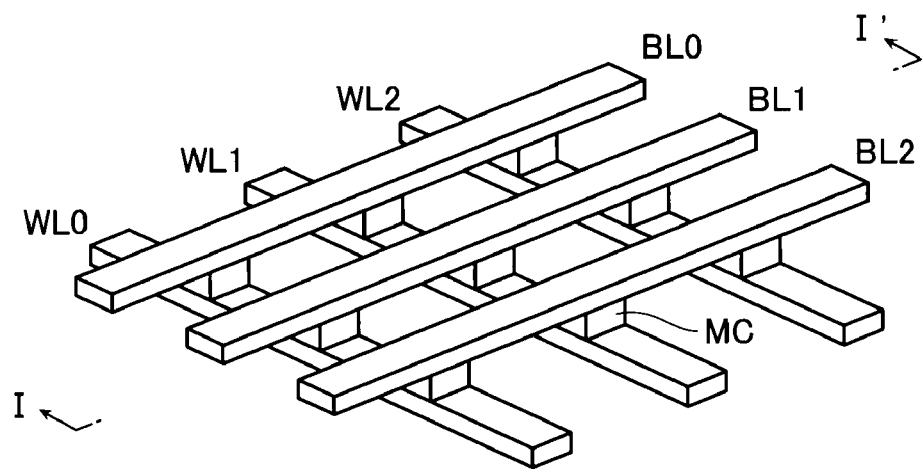
FIG. 2 is a perspective view of part of a memory cell array in the nonvolatile semiconductor memory device in accordance with the first embodiment.
Figure 3:
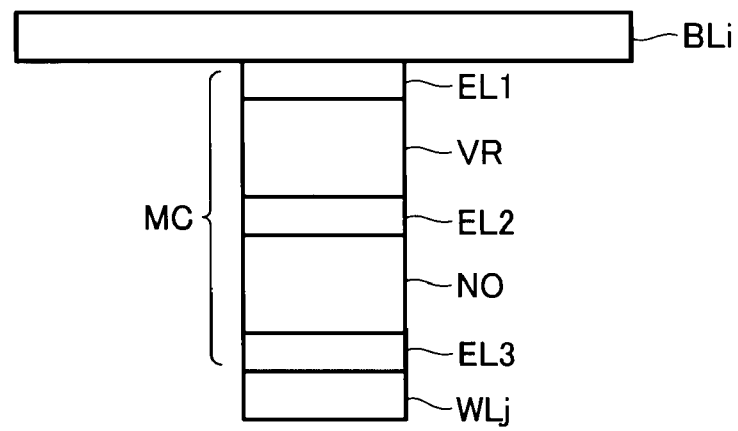
FIG. 3 is a cross-sectional view of one individual memory cell taken along the line I-I' and seen in the direction of the arrows in FIG. 2.

FIG. 2 is a perspective view of part of the memory cell array 1, and FIG. 3 is a cross-sectional view of one memory cell taken along the line I-I' and seen in the direction of the arrows in FIG. 2.

There are plural word lines WL0-WL2 as first lines disposed in parallel, which intersect plural bit lines BL0-BL2 as second lines disposed in parallel. A memory cell MC is disposed at each of intersections of the word lines WL0-WL2 and bit lines BL0-BL2 to be sandwiched therebetween. Desirably, the word lines WL and bit lines BL are configured by a heat-resistive low-resistance material such as W, WSi, NiSi, or CoSi.

As shown in FIG. 3, the memory cell MC comprises a serial connection circuit of a variable resistor VR and a non-ohmic element NO.

Used for the variable resistor VR is a substance which can vary its resistance through current, heat, or chemical energy on voltage application. Disposed above and below the variable resistor VR are electrodes EL1 and EL2 configured to function as a barrier metal layer and an adhesive layer. Material of the electrodes may include Pt, Au, Ag, TiAlN, SrRuO, Ru, RuN, Ir, Co, Ti, TiN, TaN, LaNiO, Al, PtIrO$_x$, PtRhO$_x$, Rh/TaAlN, or the like. In addition, a metal film for uniformizing orientation may also be interposed. Moreover, a separate buffer layer, barrier metal layer, adhesive layer, and so on, may further be interposed.

The variable resistor VR may include one that comprises a composite compound containing cations of a transition element and varies the resistance through migration of the cations (ReRAM).

Figure 4:
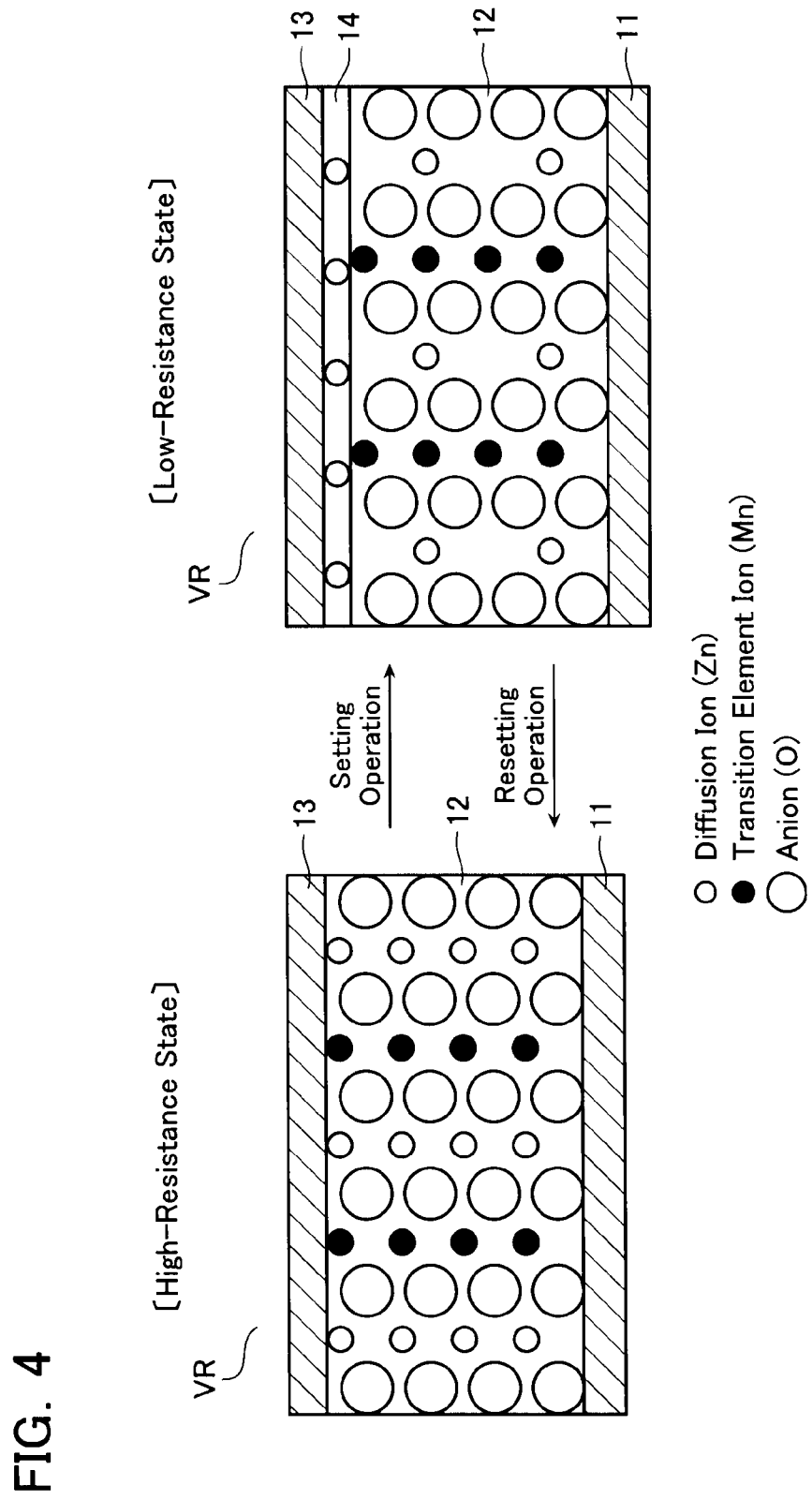
FIG. 4 is a schematic cross-sectional view showing one example of a variable resistor in the memory cell in the nonvolatile semiconductor memory device in accordance with the first embodiment.

FIG. 4 is a view showing an example of the variable resistor VR. The variable resistor VR shown in FIG. 4 includes a recording layer 12 arranged between electrode layers 11 and 13. The recording layer 12 is composed of a composite compound containing at least two types of cation elements. At least one of the cation elements is a transition element having the d-orbit incompletely filled with electrons, and the shortest distance between adjacent cation elements is 0.32 nm or lower. Specifically, it is represented by a chemical formula $A_xM_yX_z$ (A and M are different elements) and may be configured by material having a crystalline structure such as a spinel structure ($AM_2O_4$), an ilmenite structure ($AMO_3$), a delafossite structure ($AMO_2$) a $LiMoN_2$ structure ($AMN_2$), a wolframite structure ($AMO_4$), an olivine structure ($A_2MO_4$), a hollandite structure ($A_xMO_2$), a ramsdellite structure ($A_xMO_2$), and a perovskite structure ($AMO_3$).

In the example of FIG. 4, A comprises Zn, M comprises Mn, and X comprises O. In the recording layer 12 of FIG. 4, a small white circle represents a diffused ion (Zn), a large white circle represents an anion (O), and a small black circle represents a transition element ion (Mn). The initial state of the recording layer 12 is the high-resistance state. When the electrode layer 11 is kept at a fixed potential and a negative voltage is applied to the electrode layer 13, part of diffused ions in the recording layer 12 migrate toward the electrode layer 13 to reduce diffused ions in the recording layer 12 relative to anions. The diffused ions arrived at the electrode layer 13 accept electrons from the electrode layer 13 and precipitate as a metal, thereby forming a metal layer 14. Inside the recording layer 12, anions become excessive and consequently increase the valence of the transition element ion in the recording layer 12. As a result, injection of carriers causes the recording layer 12 to become electron conducting, thereby completing a setting operation. On reading, a current may be allowed to flow, a value of which is minute enough to prevent resistance variation occurring in the material configuring the recording layer 12. The low-resistance state may be reset to the high-resistance state (initial state) by supplying a large current flow in the recording layer 12 for a sufficient time, which causes Joule heating to facilitate the oxidation reduction reaction in the recording layer 12. Application of an electric field in the opposite direction from that at the time of setting may also allow a resetting operation to be performed.

Figure 5:
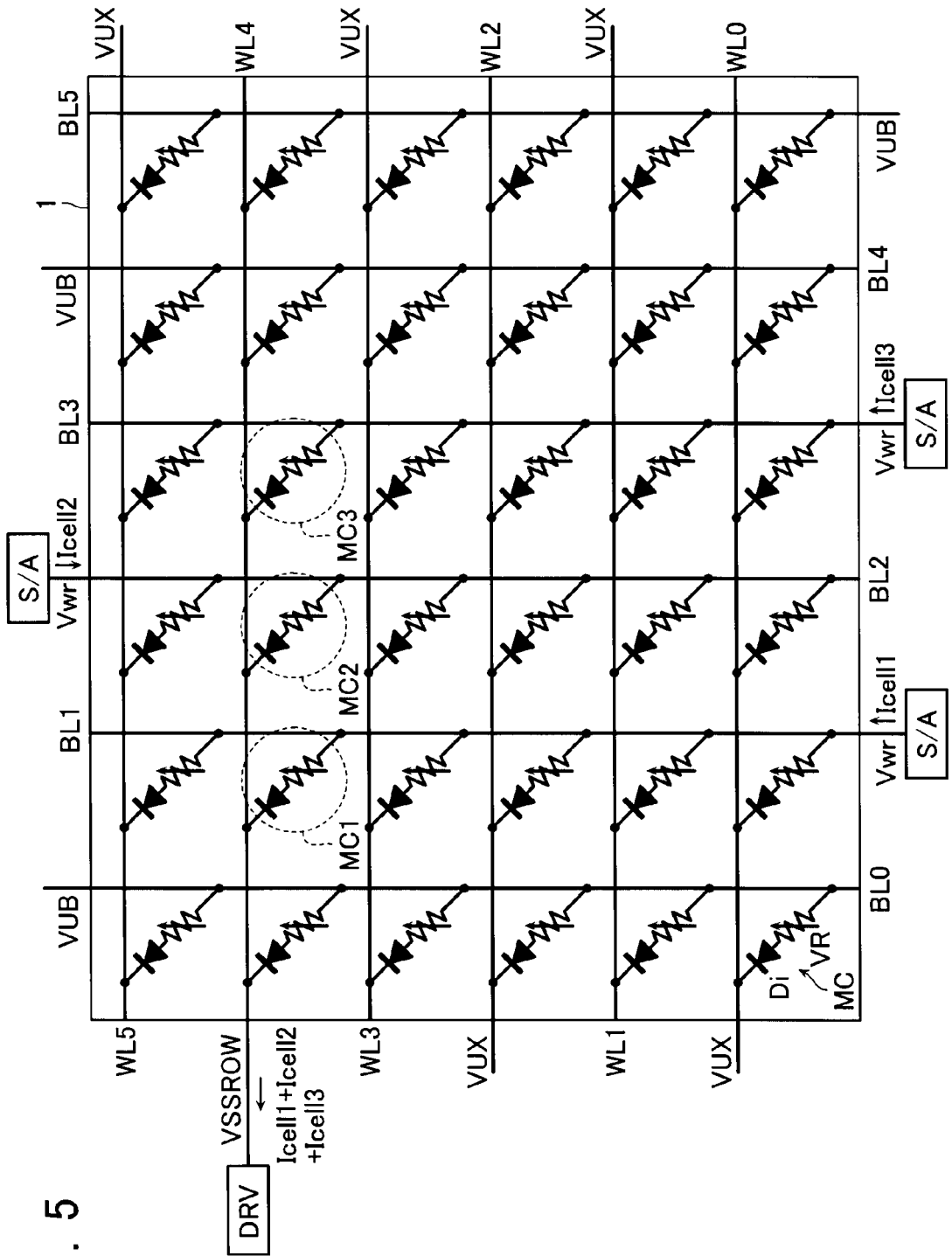
FIG. 5 is a circuit diagram of the memory cell array in the nonvolatile semiconductor memory device in accordance with the first embodiment.

FIG. 5 is an equivalent circuit diagram showing details of the memory cell array 1 shown in FIG. 1. Note that a diode D1 is utilized here as the non-ohmic element NO. Note also that, in order to simplify explanation, description proceeds assuming that the memory cell array 1 has a single layer structure.

In FIG. 5, the memory cell MC in the memory cell array 1 is configured by the diode D1 and the variable resistor VR connected in series. The diode D1 has its cathode connected to the word line WL and its anode connected to the bit line BL via the variable resistor VR. Each bit line BL is provided with a sense amplifier circuit S/A in the column control circuit 2. The sense amplifier circuit S/A may include various types, such as a single ended type or a differential type using a reference cell. In addition, the word line WL is provided with a word line driver DRV in the row control circuit 3. This word line driver DRV supplies to the word line WL voltages required in writing data/data erase or data read.

Note that the memory cell MC may be selected individually or there may be a format in which data of a plurality of memory cells MC connected to a selected word line WL is read in one lot. Moreover, in the memory cell array 1, current may be caused to flow from the word line WL side to the bit line BL side.

[Column Control Circuit]

Next, the column control circuit 2 in the nonvolatile semiconductor memory device in accordance with the present embodiment is described. However, first, operation of nonvolatile memory is described.

As shown by the dotted line circles in FIG. 5, the case is now assumed in which the memory cells MC1-3 connected to the word line WL4 and the bit lines BL1-3 are selected, and these selected memory cells MC1-3 are accessed.

Erase of data (write of "1" data) is performed by an erase operation configured, for example, to apply to the selected word line WL4 a row ground voltage VSSROW close to a ground voltage VSS and apply to the other word lines WL a voltage VUX about 0.8 V lower than a write voltage Vwr, to apply to the selected bit lines BL1-3 the write voltage Vwr (=Vrst) and apply to the other bit lines BL a voltage VUB about 0.8 V higher than the row ground voltage VSSROW, and to pass a current of about 1 µA-10 µA for a period of 500 ns-2 µs.

Writing data (write of "0" data) is performed by a write operation configured, for example, to apply to the selected word line WL4 the row ground voltage VSSROW and apply to the other word lines WL the voltage VUX about 0.8 V lower than the write voltage Vwr, to apply to the selected bit lines BL1-3 the write voltage Vwr (=VSEL) and apply to the other bit lines BL the voltage VUB about 0.8 V higher than the row ground voltage VSSROW, and to pass a current of about 10 nA for a period of 10 ns-100 ns.

Read of data is performed by a read operation configured, for example, to apply to the selected word line WL4 and the unselected bit lines BL the row ground voltage VSSROW close to the ground voltage VSS, and to apply to the selected bit lines BL1-3 and the unselected word lines WL the voltage VUX. A voltage VUX-VSSROW at this time has a voltage value that does not cause a change in the resistance state of the variable resistor VR in the selected memory cells MC1-3. At this time, the sense amplifier circuits S/A monitor currents Icell1-3 flowing in the selected memory cells MC1-3 to determine if the resistance state of the variable resistor VR in the memory cells MC1-3 is the low-resistance state ("0" data) or the high-resistance state ("1" data).

[Setting Operation]

Figure 6:
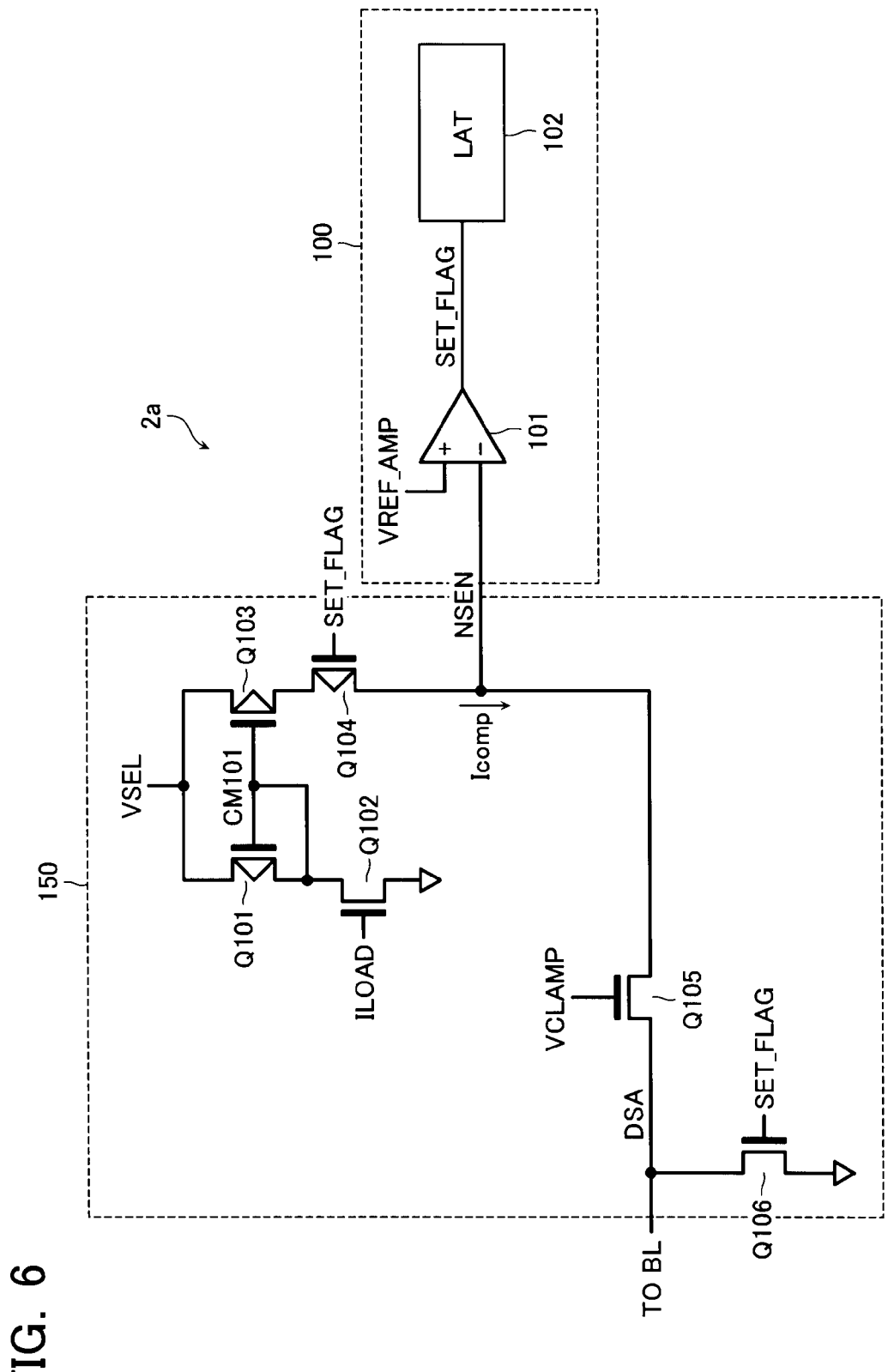
FIG. 6 is a circuit diagram of a setting circuit in a column control circuit in accordance with the first embodiment.

Next, a configuration of a setting circuit 2a employed in the setting operation in the column control circuit 2 is described with reference to FIG. 6.

The setting circuit 2a is provided internally in the sense amplifier circuit S/A and includes a set state detection circuit 100 and a setting voltage supply circuit 150.

The set state detection circuit 100 includes a comparator 101 operative to compare a voltage of a sense node NSEN on an anode side of the diode of the memory cell MC and a certain reference voltage VREF_AMP. During the setting operation, the setting circuit 2a causes a constant cell current to flow in the memory cell MC. In this case, a fall in the resistance state of the variable resistor in the memory cell MC appears as a drop in the voltage of the sense node NSEN. The set state detection circuit 100 detects that the memory cell MC has achieved a set state through detection by the comparator 101 that the voltage of the sense node NSEN has fallen to the reference voltage VREF_AMP or below.

The setting voltage supply circuit 150 includes a PMOS transistor Q101 and an NMOS transistor Q102 connected in series between a setting voltage VSEL terminal and a ground terminal. Of these transistors, the transistor Q102 has its gate inputted with a load current signal ILOAD. As a result, the transistors Q101 and Q102 configure a constant current circuit. The setting voltage supply circuit 150 also includes PMOS transistors Q103 and Q104 connected in series between the setting voltage VSEL terminal and the sense node NSEN and arranged in parallel to the constant current circuit. Of these transistors, the transistor Q103 configures a current mirror circuit CM101 by combination with the transistor Q101. The setting voltage supply circuit 150 additionally includes a voltage clamp-dedicated NMOS transistor Q105 between the sense node NSEN and a node DSA connected to the bit line BL. This transistor Q105 has its gate applied with a clamp voltage VCLAMP. As a result, a voltage of the bit line BL is clamped. The setting voltage supply circuit 150 further includes an NMOS transistor Q106 connected between the node DSA and the ground terminal. Turning on this NMOS transistor Q106 causes the voltage of the bit line BL to be discharged.

The set state detection circuit 100 includes: the comparator 101 operative to compare the voltage of the sense node NSEN and the certain reference voltage VREF_AMP and output a set flag SET_FLAG which is a result of the comparison; and a latch circuit 102 operative to retain a state of the set flag SET_FLAG. The set flag SET_FLAG retained in the latch circuit 102 is inputted to gates of the transistors Q104 and Q106 in the setting voltage supply circuit 150. As a result, when the set flag SET_FLAG becomes "H", the transistor Q104 is turned off, whereby supply of the setting voltage VSEL from the setting voltage supply circuit 150 to the selected memory cell is stopped. In addition, the transistor Q106 is turned on, whereby the voltage of the bit line BL is discharged.

In addition, the set flag SET_FLAG retained in the latch circuit 102 is outputted, in parallel or serially in certain bit amounts, via the data input/output buffer 4, to the external controller 10.

Next, the setting operation employing the setting circuit 2a having the above-described configuration is described.

Figure 7:
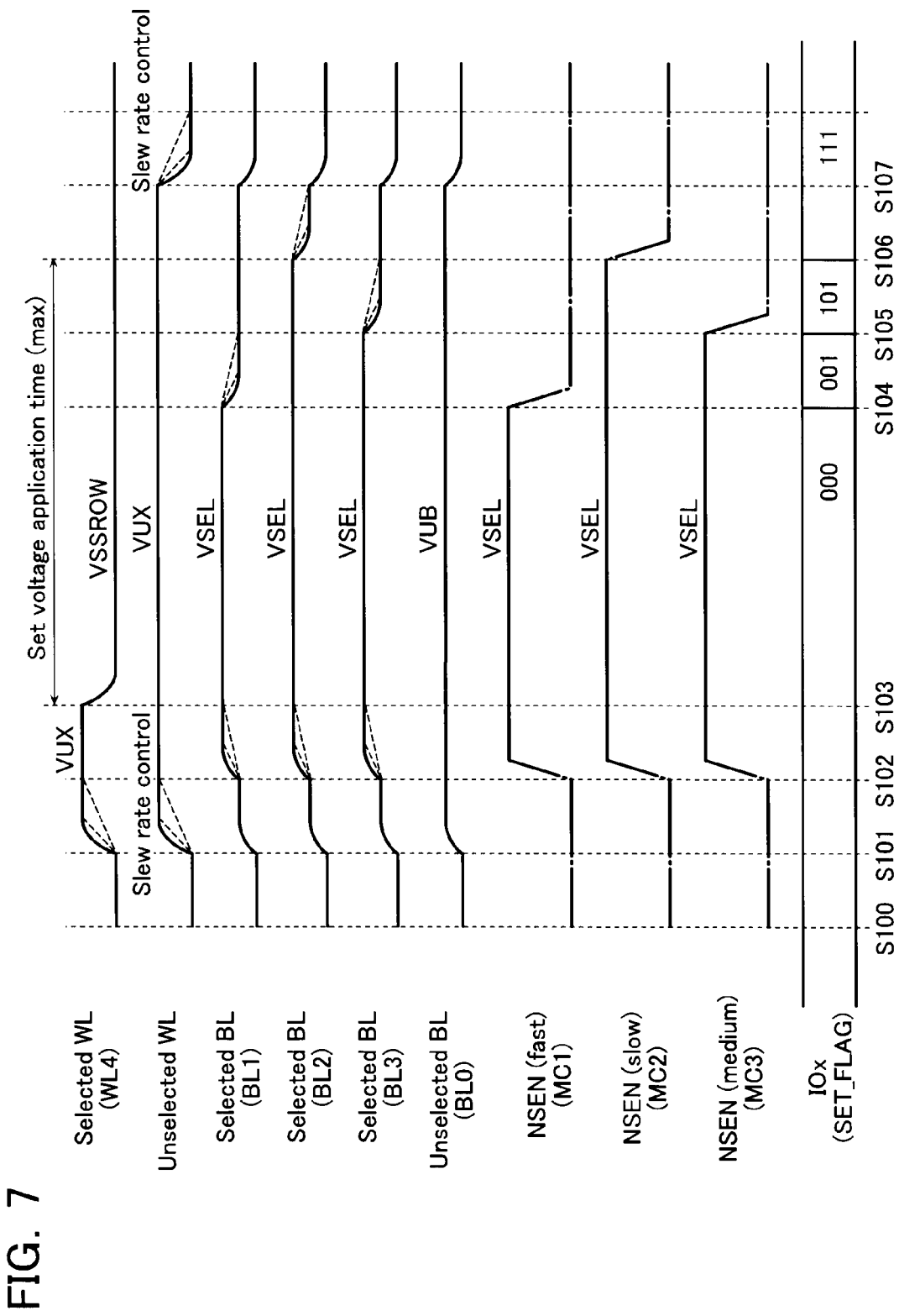
FIG. 7 is a timing chart explaining a setting operation due to the setting circuit in accordance with the first embodiment.

FIG. 7 is an operation waveform chart of the setting operation in the nonvolatile semiconductor memory device in accordance with the present embodiment.

Prior to the setting operation (step S100), the word lines WL, bit lines BL, and sense nodes NSEN are all set to ground voltage.

First, in step S101, the word lines WL are supplied with an unselected word line voltage VUX, and the bit lines BL are supplied with an unselected bit line voltage VUB.

Subsequently, in step S102, the setting voltage VSEL is supplied to the selected bit lines BL1-3 from the setting voltage supply circuit 150. At this time, the voltage of the sense node NSEN rises to the setting voltage VSEL.

Then, in step S103, the selected word line WL4 is lowered to a word line ground voltage VSSROW. This causes a voltage VSEL-VSSROW to be applied to the memory cells MC1-3. At this point in time, the memory cells MC1-3 are in the high-resistance state, and the voltage of the sense node NSEN is also higher than the reference voltage VREF_AMP, hence the set flag SET_FLAG which is the output of the comparator 101 remains at "L".

Subsequently, in step S104, the setting operation of the memory cell MC1 is completed. Due to this setting operation completion, the memory cell MC1 is in the low-resistance state. In this case, the voltage of the sense node NSEN connected to the memory cell MC1 also becomes lower than the reference voltage VREF_AMP, hence the set flag SET_FLAG becomes "H". When the set flag SET_FLAG becomes "H" in this way, the transistor Q104 in the setting voltage supply circuit 150 is turned off. As a result, supply of the setting voltage VSEL from the setting voltage supply circuit 150 to the bit line BL1 is stopped.

Then, in step S105, the setting operation of the memory cell MC3 is completed. In this case, similarly to in step S104, the voltage of the sense node NSEN connected to the memory cell MC3 becomes lower than the reference voltage VREF_AMP, whereby the set flag SET_FLAG becomes "H". As a result, supply of the setting voltage VSEL from the setting voltage supply circuit 150 to the bit line BL3 is stopped.

Furthermore, in step S106, the setting operation of the memory cell MC2 is completed. In this case too, similarly to in steps S104 and S105, the voltage of the sense node NSEN connected to the memory cell MC2 becomes lower than the reference voltage VREF_AMP, whereby the set flag SET_FLAG becomes "H". As a result, supply of the setting voltage VSEL from the setting voltage supply circuit 150 to the bit line BL2 is stopped.

Finally, in step S107, setting operation completion of all of the memory cells MC1-3 requiring the setting operation is signaled, whereby supply of the unselected word line voltage VUX to the unselected word lines WL is stopped.

The above completes the setting operation on the memory cells MC1-3.

Note that during the setting operations in this example, the data input/output buffer 4 functions as an output circuit operative to output the set flag SET_FLAG showing the resistance state of the memory cells MC1-MC3 as three-bit flag data to the external controller 10. The first bit (extreme right), second bit (center) and third bit (extreme left) of the three-bit flag data correspond to the set flag SET_FLAG of, respectively, the memory cells MC1, MC2, and MC3. As shown by IOx in FIG. 7, flag data to the external controller 10 is outputted inverting the bit corresponding to the position of the memory cell MC that has undergone setting, in the manner of "000"→"001"→"101"→"111", each time one of the memory cells MC1-MC3 attains the set state. As a result, the external controller 10 can ascertain from external which of the memory cells MC have changed to the set state.

[Resetting Operation]

Figure 8:
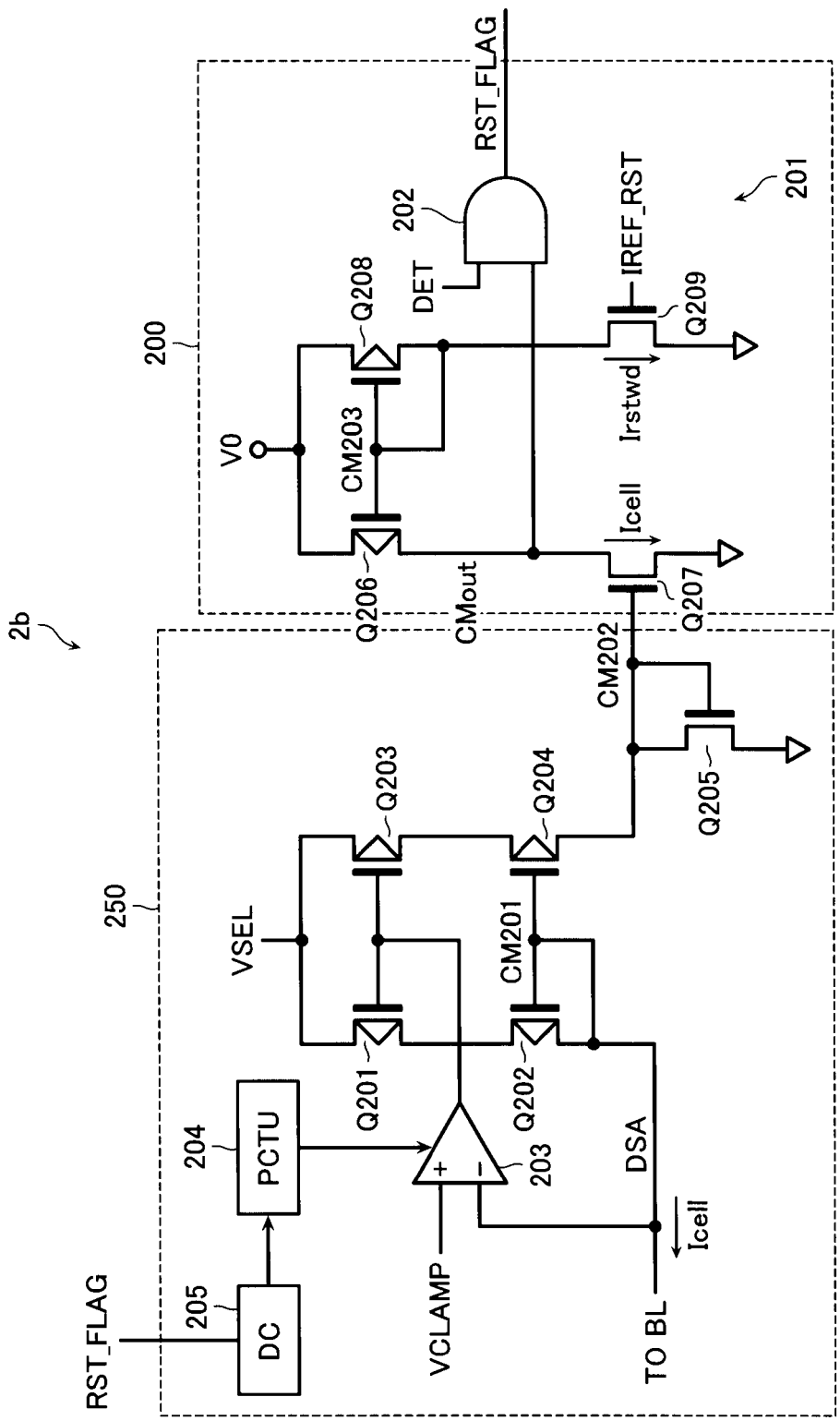
FIG. 8 is a circuit diagram of a resetting circuit in the column control circuit in accordance with the first embodiment.

Next, a configuration of a resetting circuit 2b employed in the resetting operation in the column control circuit 2 is described with reference to FIG. 8.

The resetting circuit 2b is provided internally in the sense amplifier circuit S/A and includes a reset state detection circuit 200 and a resetting voltage supply circuit 250.

The reset state detection circuit 200 includes a comparator 201 operative to compare a cell current flowing in the memory cell MC and a certain reference current Irstwd. During the resetting operation, the resetting circuit 2b causes a constant resetting voltage to be supplied to the memory cell MC. In this case, a rise in the resistance value of the variable resistor in the memory cell MC appears as a drop in the cell current. The reset state detection circuit 200 detects that the memory cell MC has achieved a reset state through detection by the comparator 201 that the cell current has fallen to the reference current Irstwd or below.

The resetting voltage supply circuit 250 includes PMOS transistors Q201 and Q202 connected in series between the setting voltage VSEL terminal and the node DSA. The resetting voltage supply circuit 250 also includes PMOS transistors Q203 and Q204 connected in series between the setting voltage VSEL terminal and the ground terminal. Of these transistors, the transistor Q204 configures a current mirror circuit CM201 by combination with the transistor Q202. The resetting voltage supply circuit 250 further includes an operational amplifier 203 having its positive input terminal connected to a certain clamp voltage VCLAMP, its negative input terminal connected to the node DSA, and its output terminal connected to gates of the transistors Q201 and Q203. The operational amplifier 203 controls the transistors Q201 and Q203 according to the difference between the clamp voltage VCLAMP and the voltage of the node DSA. As a result, the resetting voltage supply circuit 250 can generate a resetting voltage Vrst from the setting voltage VSEL and supply this resetting voltage Vrst stably to the bit line BL. The operational amplifier 203 herein is driven by a power supply control unit 204 which operates receiving a direct-current voltage from a direct-current power supply 205.

The reset state detection circuit 200 includes a PMOS transistor Q206 and an NMOS transistor Q207 connected in series between a certain voltage V0 terminal and the ground terminal. Of these transistors, the transistor Q207 configures a current mirror circuit CM202 by combination with the transistor Q205 in the resetting voltage supply circuit 250. Hence, a cell current Icell flowing in the node DSA via the current mirror circuits CM201 and CM202 flows in this transistor Q207. The reset state detection circuit 200 also includes a PMOS transistor Q208 and an NMOS transistor Q209 connected in series between the voltage V0 terminal and the ground terminal. Of these transistors, the transistor Q208 configures a current mirror circuit CM203 by combination with the transistor Q206. On the other hand, the transistor Q209 is controlled by a reference current signal IREF_RST. This allows the constant reference current Irstwd to flow in the transistor Q209. This reference current Irstwd flows in the transistor Q206 via the current mirror circuit CM203. As a result, a current Irstwd-Icell can be extracted from a node CMout between the transistors Q206 and Q207. The reset state detection circuit 200 further includes an AND circuit 202 having the node CMout connected to its input terminal. This AND circuit 202 has a detection signal DET connected to its other input terminal. In other words, a reset flag RST_FLAG which is an output of this AND circuit 202 becomes "H" only in the case that the detection signal DET is activated and cell current Icell is smaller than the reference current Irstwd. This reset flag RST_FLAG is latched in the latch circuit 102 of the setting circuit 2a and is used in control of the direct-current power supply 205, that is, the direct-current power supply 205 is inactivated when the reset flag RST_

FLAG is "H". As a result, supply of the resetting voltage Vrst from the resetting voltage supply circuit 250 to the bit line BL is stopped. Note that the comparator 201 shown in FIG. 8 is configured by the transistors Q206-209 and the AND circuit 202. Note also that the output unit of the reset flag RST_FLAG may be configured similarly to the output unit of the set flag SET_FLAG. In addition, the set flag SET_FLAG and the reset flag RST_FLAG may be configured to be latched in the latch circuit via an OR circuit not shown.

The reset flag RST_FLAG retained in the latch circuit 102 is outputted, in parallel or serially in certain bit amounts, via the data input/output buffer 4, to the external controller 10.

Next, the resetting operation employing the resetting circuit 2b having the above-described configuration is described.

Figure 9:
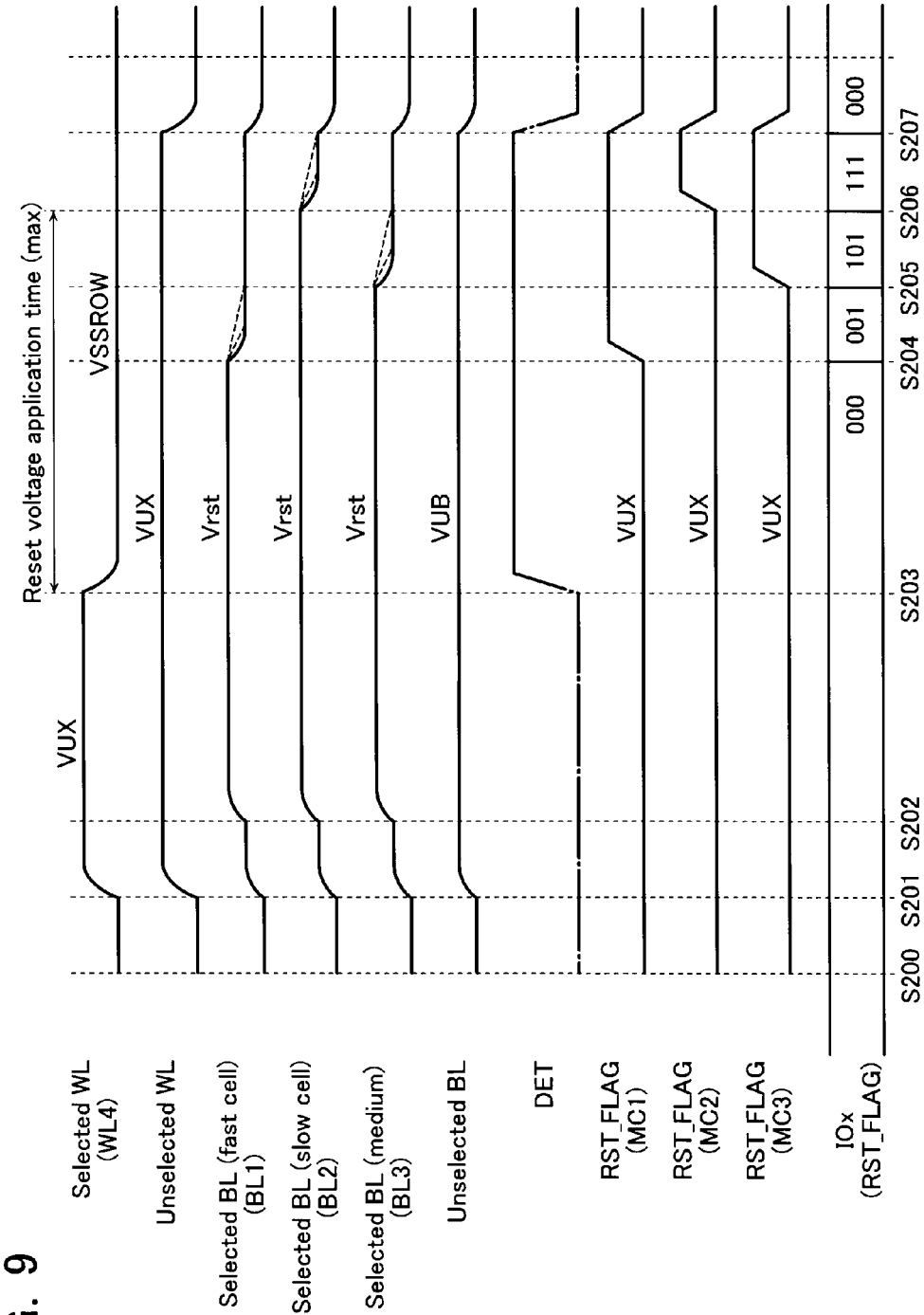
FIG. 9 is a timing chart explaining a resetting operation due to the setting circuit in accordance with the first embodiment.

FIG. 9 is an operation waveform chart of the resetting operation in the nonvolatile semiconductor memory device in accordance with the present embodiment.

Prior to the resetting operation (step S200), the word lines WL and bit lines BL are all set to ground voltage.

First, in step S201, the word lines WL are supplied with the unselected word line voltage VUX, and the bit lines BL are supplied with the unselected bit line voltage VUB.

Subsequently, in step S202, the resetting voltage Vrst is supplied to the selected bit lines BL1-BL3 from the resetting voltage supply circuit 250.

Then, in step S203, the selected word line WL4 is lowered to the word line ground voltage VSSROW. This causes a voltage Vrst-VSSROW to be applied to the memory cells MC1-3. In addition, the detection signal DET is set to "H", and detection of the cell current Icell by the AND circuit 202 is started. At this point in time, the memory cells MC1-MC3 have their variable resistors in the low-resistance state, and the cell current Icell is larger than the reference current Irstwd, hence the reset flag RST_FLAG which is the output of the AND circuit 202 remains at "L".

Subsequently, in step S204, the resetting operation of the memory cell MC1 is completed. The completion of the resetting operation leads the memory cell MC1 to the high-resistance state. In addition, the cell current Icell also becomes lower than the reference current Irstwd, hence the reset flag RST_FLAG becomes "H". When the reset flag RST_FLAG becomes "H" in this way, the direct-current power supply 205 in the resetting voltage supply circuit 250 is inactivated. As a result, supply of the resetting voltage Vrst from the resetting voltage supply circuit 250 to the bit line BL1 is stopped.

Then, in step S205, the resetting operation of the memory cell MC3 is completed, whereby the reset flag RST_FLAG corresponding to the memory cell MC3 becomes "H". As a result, supply of the resetting voltage Vrst from the resetting voltage supply circuit 250 to the bit line BL3 is stopped.

Furthermore, in step S206, the resetting operation of the memory cell MC2 is completed, whereby the reset flag RST_FLAG corresponding to the memory cell MC2 becomes "H". As a result, supply of the resetting voltage Vrst from the resetting voltage supply circuit 250 to the bit line BL2 is stopped.

Finally, in step S207, resetting operation completion of all of the memory cells MC1-MC3 requiring the resetting operation is signaled, whereby supply of the unselected word line voltage VUX to the unselected word lines WL is stopped. In addition, the detection signal DET is set to "L", and the reset flag RST_FLAG which is the output of the AND gate 202 is set to "L", thereby preparing for the next resetting operation.

The above completes the resetting operation on the memory cells MC1-3.

Note that during the resetting operations in this example too, similarly to in the setting operation, the data input/output buffer 4 functions as an output circuit operative to output the reset flag RST_FLAG showing the resistance state of the memory cells MC1-MC3 as three-bit flag data to the external controller 10. That is, as shown by IOx in FIG. 9, flag data to the external controller 10 is outputted inverting the bit corresponding to the position of the memory cell MC that has undergone resetting, in the manner of "000"→"001"→"101"→"111", each time one of the memory cells MC1-MC3 attains the reset state. As a result, the external controller 10 can ascertain from external which of the memory cells MC have changed to the reset state.

[Forming Operation]

Figure 10:
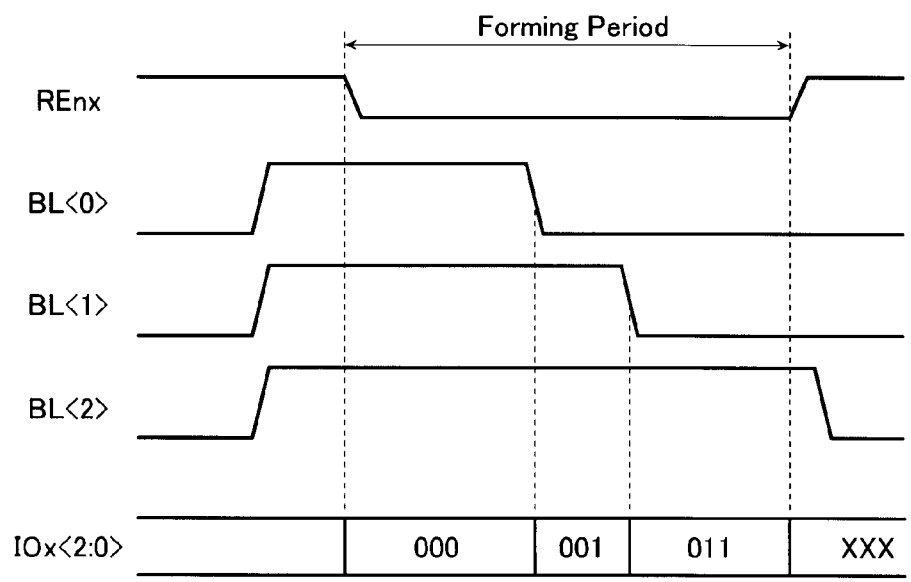
FIG. 10 is a timing chart explaining a forming operation of the nonvolatile semiconductor memory device in accordance with the first embodiment.

FIG. 10 shows an output state of bit line voltages and flag data during forming. In the forming operation too, similarly to in the setting operation, change in resistance value of the memory cells MC is detected, and, each time forming of a memory cell MC is completed, a flag is outputted as multiple-bit data to the external controller 10, whereby a forming progress state can be ascertained by the external controller 10.

Flag Data Utilization Example 1

The external controller 10 can utilize the flag data to statistically derive voltage application conditions for which optimum cycle time to completion of setting or resetting can be obtained.

Figure 11:
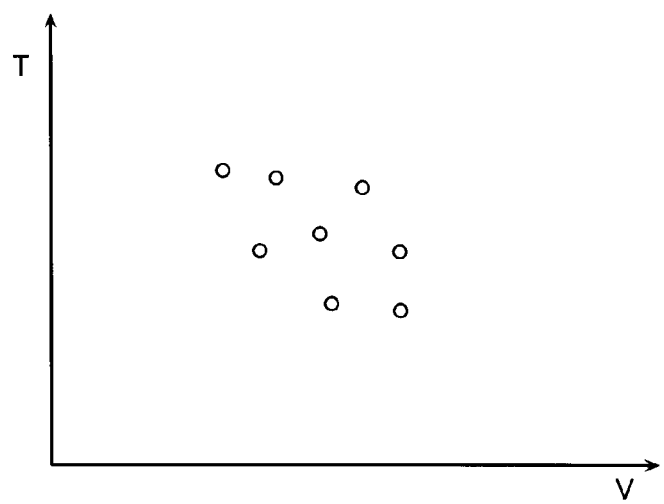
FIG. 11 is a view showing correlation between setting voltage and setting time using flag data in the nonvolatile semiconductor memory device in accordance with the first embodiment.

FIG. 11 shows a relationship between write voltage and setting time. For example, a GIST (Built in self test) is utilized, for example, to aggregate the time to completion of setting or resetting using flag data while sequentially changing the voltage of the word lines WL. As shown in FIG. 11, the above-described process allows correlation between write voltage and setting or resetting time to be obtained. This correlation is analyzed to appropriately adjust operation conditions (write voltage, write time, and so on) during memory operations.

Flag Data Utilization Example 2

Figure 12:
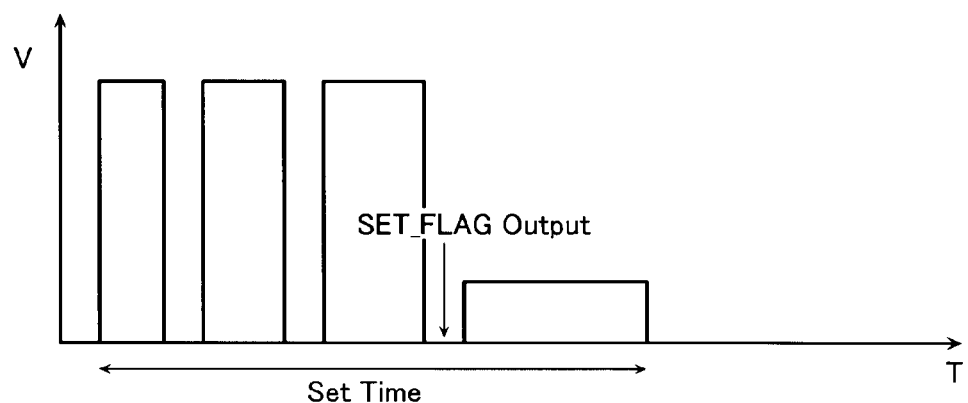
FIG. 12 is a timing chart showing a timing waveform during the setting operation in the nonvolatile semiconductor memory device in accordance with the first embodiment.

In the present embodiment, since the resistance state of the memory cells MC is outputted directly as flag data in real-time, the resistance state of the memory cells can be ascertained without performing verify. Consequently, as shown in FIG. 12, in the present embodiment, it is required only to continue applying the write pulse while gradually increasing the write time until the set flag or reset flag is outputted, and perform verify at the point in time when flags corresponding to certain memory cells or all memory cells have been outputted. This enables the number of verifies to be reduced and the setting operation time to be significantly decreased.

As described above, there is a large difference in setting time between individual variable resistors even in the same memory cell array, whereby it has been extremely difficult to set the write voltage appropriately. That is, setting the write time short leads to reliability as a memory element being impaired, while setting the write time too long leads to operational speed being sacrificed. Moreover, this case results in memory cells of fast operation speed also being operated in conformity with a portion of memory cells of slow operation speed, thereby preventing the performance of the memory cells from being effectively utilized.

In the present embodiment, the write time can be adjusted according to the resistance state of the memory cells, that is, the setting operation can be performed in accordance with the operation speed of the respective memory cells; hence, unnecessary standby time can be omitted, thereby enabling setting operation time to be reduced. Moreover, during the setting operation, application of voltage by the pulse generator 9 awaits confirmation of SET_FLAG before ending. Conventionally, there was no output of a SET_FLAG, and success/failure of the write operation was judged only by a verify operation. In contrast, the present embodiment allows success/failure of the write operation to be constantly monitored by the external controller 10, whereby reliability as memory elements is also improved.

Second Embodiment

Flag Data Utilization Example 3

Figure 13:
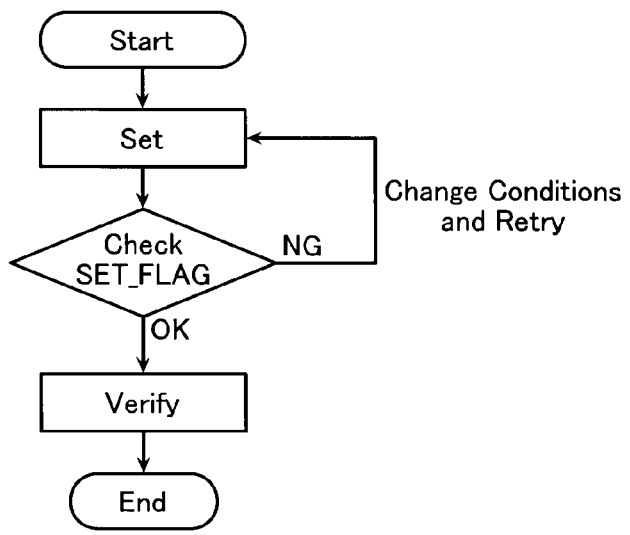
FIG. 13 is a flow chart of a setting operation in a second embodiment.

In the above-described first embodiment, write voltage is always constant. However, in the second embodiment, write voltage is gradually changed in accordance with a state of the memory cells MC. FIG. 13 shows a flowchart at this time. First, as shown in FIG. 13, a write voltage is applied to the memory cells MC to perform a write operation. After a certain condition has been satisfied (for example, passing of a constant time, confirmation of SET_FLAG a certain number of times, and so on), control conditions are changed (for example, the write voltage is raised), and a write operation is further performed on remaining memory cells MC. The above operation is repeated until the SET_FLAG of all object memory cells MC is outputted.

This kind of method enables a comparatively large write voltage to be applied only to memory cells requiring such a large write voltage. As a result, further reduction in the setting operation time is made possible without causing any problems of increased power consumption, increased heat generation, or the like. Note that in the above description, applied voltage is changed stepwise. However, applied voltage may also be changed continuously.

Third Embodiment

Flag Data Utilization Example 4

Figure 14:
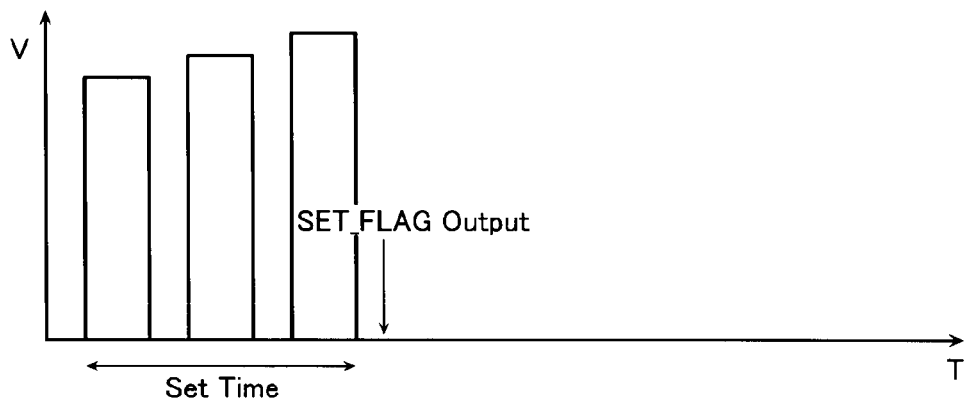
FIG. 14 is a timing chart explaining a setting operation in a third embodiment.

FIG. 14 is a simplified timing chart of a setting operation in a third embodiment of the present invention. The setting operation in the present embodiment is basically similar to the setting operation described in the first embodiment. However, whereas in the first embodiment the verify operation is performed subsequent to SET_FLAG output, in the present embodiment the verify operation is completely omitted.

Omission of the verify operation in the present embodiment has the aim of further reducing the setting operation time. Since the resistance state of the memory cells MC is outputted to the external controller 10 by means of flags, it is possible to confirm the resistance state of the memory cells even if the verify operation is omitted. Moreover, although the present embodiment is configured such that the write voltage is gradually changed (mainly increased), it may also be configured such that an equal write voltage is constantly applied. Furthermore, a format may be adopted in which verify is performed only on a portion of memory cells and is not performed on memory cells other than the portion of memory cells. Note that the above description exemplifies the setting operation, but a similar method may be adopted also for the resetting operation.

[Other]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
a memory cell array, the memory cell array including a plurality of first lines, a plurality of second lines configured to intersect the first lines, and a plurality of electrically rewritable memory cells disposed at each of intersections of the first lines and the second lines, each of the memory cells being configured from a variable resistor operative to store a resistance value of the variable resistor as data in a nonvolatile manner;
a voltage supply circuit operative to apply a certain voltage to the memory cells via the first lines and the second lines during writing data to the memory cells or forming of the memory cells;
a detection circuit operative to detect a change of the resistance value of the variable resistor in the memory cell during application of the certain voltage to the memory cells and output the detected change of the resistance value of the variable resistor as detection information; and
an output circuit operative to output to external at least a portion of the detection information outputted from the detection circuit.

2. The nonvolatile semiconductor memory device according to claim 1,
wherein the detection circuit is connected to one ends of the first lines and is operative to detect a current change or a voltage change in the first lines and to output the detected current change or the detected voltage change as the detection information.

3. The nonvolatile semiconductor memory device according to claim 1,
wherein the detection circuit comprises:
a constant current circuit operative to supply a constant current to the memory cells via the first lines;
a differential amplifier circuit operative to compare a voltage of a sense node provided in a path of the constant current and a reference voltage, and to output a result of comparing the voltage of the sense node and the reference voltage as the detection information; and
a switch circuit operative to control applying the certain voltage from the voltage supply circuit to the memory cells based on the detection information outputted from the differential amplifier circuit.

4. The nonvolatile semiconductor memory device according to claim 1,
wherein the detection circuit comprises:
a constant voltage circuit operative to supply a constant voltage to the memory cells via the first lines;
a constant current circuit operative to generate a reference current;
a comparison circuit operative to compare a current supplied to the memory cells via the first lines and the reference current, and to output a result of comparing the current supplied to the memory cells and the reference current as the detection information; and a switch circuit operative to control applying the certain voltage from the voltage supply circuit to the memory cells based on the detection information outputted from the comparison circuit.

5. The nonvolatile semiconductor memory device according to claim 1,
wherein the detection circuit includes a latch circuit operative to latch the detection information.

6. The nonvolatile semiconductor memory device according to claim 1,
wherein the output circuit is operative to output to external n bits of the detection information corresponding to n memory cells, and
wherein the n bits of the detection information is information where, if the resistance value of the variable resistor in a memory cell among the n memory cells changes, a bit in a position corresponding to the memory cell in which the resistance value of the variable resistor changes is inverted in real-time.

7. The nonvolatile semiconductor memory device according to claim 1, further comprising:
a controller operative to control writing data to the memory cells.

8. The nonvolatile semiconductor memory device according to claim 7,
wherein the controller is operative to judge on the basis of the detection information outputted from the output circuit whether or not writing data to the memory cells is complete, and to increase at least one of the certain voltage applied to the memory cells and an voltage application time to the memory cells if writing data to the memory cells is not complete.

9. The nonvolatile semiconductor memory device according to claim 7,
wherein the controller is operative to judge on the basis of the detection information outputted from the output circuit whether or not writing data to the memory cells is complete, and to not perform a verify operation if writing data to all of the memory cells is not complete.

10. A method of determining condition of writing data utilizing a nonvolatile semiconductor memory device,
the nonvolatile semiconductor memory device comprising:
a memory cell array, the memory cell array including a plurality of first lines, a plurality of second lines configured to intersect the first lines, and a plurality of electrically rewritable memory cells disposed at each of intersections of the first lines and the second lines, each of the memory cells being configured from a variable resistor operative to store a resistance value of the variable resistor as data in a nonvolatile manner;
a voltage supply circuit operative to apply a certain voltage to the memory cells via the first lines and the second lines during writing data to the memory cells or forming of the memory cells;
a detection circuit operative to detect a change of the resistance value of the variable resistor in the memory cells during application of the certain voltage to the memory cells and output the detected change of the resistance value of the variable resistor as detection information; and
an output circuit operative to output to external at least a portion of the detection information outputted from the detection circuit,
the method of determining condition of writing data comprising:
accumulating writing data time to the plurality of memory cells from the detection information; and
determining an optimum value of the certain voltage applied to the memory cells from the voltage supply circuit based on the accumulated writing data time to the plurality of memory cells.

11. The method of determining condition of writing data in a nonvolatile semiconductor memory device according to claim 10, comprising:
when accumulating the writing data time, sequentially changing the certain voltage applied to the memory cells, the writing data time being a time from start of applying the certain voltage to the change of the resistance value of the variable resistor.

12. The method of determining condition of writing data in a nonvolatile semiconductor memory device according to claim 10, further comprising:
utilizing an external controller being connected to the output circuit and being operative to aggregate and analyze at least a portion of the detection information inputted from the output circuit.

13. A method of writing data utilizing a nonvolatile semiconductor memory device,
the nonvolatile semiconductor memory device comprising:
a memory cell array, the memory cell array including a plurality of first lines, a plurality of second lines configured to intersect the first lines, and a plurality of electrically rewritable memory cells disposed at each of intersections of the first lines and the second lines, each of the memory cells being configured from a variable resistor operative to store a resistance value of the variable resistor as data in a nonvolatile manner;
a voltage supply circuit operative to apply a certain voltage to the memory cells via the first lines and the second lines during writing data to the memory cells or forming of the memory cells;
a detection circuit operative to detect a change of the resistance value of the variable resistor in the memory cell during application of the certain voltage to the memory cells and output the detected change of the resistance value of the variable resistor as detection information; and
an output circuit operative to output to external at least a portion of the detection information outputted from the detection circuit,
the method of writing data comprising:
applying the certain voltage for writing data to the plurality of memory cells;
judging whether or not writing data to the memory cells is complete by referring to the detection information; and
if writing data to the memory cells is not complete, repeatedly changing voltage application conditions and performing rewrite until writing data to all of the memory cells is complete.

14. The method of writing data in a nonvolatile semiconductor memory device according to claim 13,
wherein the certain voltage is applied to the memory cells except the memory cells for which writing data is complete.

15. The method of writing data in a nonvolatile semiconductor memory device according to claim 13, comprising:
if writing data to the memory cells is not complete, increasing voltage application time to the memory cells.

16. The method of writing data in a nonvolatile semiconductor memory device according to claim 13, comprising:
if writing data to the memory cells is not complete, increasing the certain voltage applied to the memory cells.

17. The method of writing data in a nonvolatile semiconductor memory device according to claim 13, comprising:
if writing data is not complete, increasing the certain voltage applied to the memory cells and increasing voltage application time to the memory cells.

18. The method of writing data in a nonvolatile semiconductor memory device according to claim 13, comprising:
performing a verify operation only after writing data to all of the memory cells is complete.

19. The method of writing data in a nonvolatile semiconductor memory device according to claim 13, comprising:
not performing a verify operation.

20. The method of writing data in a nonvolatile semiconductor memory device according to claim 13, comprising:
performing a verify operation only on a portion of the memory cells.

* * * * *